United States Patent
Lee et al.

(10) Patent No.: US 11,962,119 B2
(45) Date of Patent: Apr. 16, 2024

(54) LIGHT SENSING SYSTEM AND ELECTRONIC APPARATUS INCLUDING THE SAME

(71) Applicant: SAMSUNG ELECTRONICS CO., LTD., Suwon-si (KR)

(72) Inventors: Eunkyung Lee, Seoul (KR); Byunggil Jeong, Anyang-si (KR); Byounglyong Choi, Seoul (KR); Jungwoo Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1188 days.

(21) Appl. No.: 16/201,455

(22) Filed: Nov. 27, 2018

(65) Prior Publication Data

US 2020/0014173 A1 Jan. 9, 2020

(30) Foreign Application Priority Data

Jul. 5, 2018 (KR) ........................ 10-2018-0078306

(51) Int. Cl.
   *H01S 5/40* (2006.01)
   *G01S 7/481* (2006.01)
   (Continued)

(52) U.S. Cl.
   CPC ........ *H01S 5/02253* (2021.01); *G01S 7/4814* (2013.01); *G01S 17/08* (2013.01); *H01S 5/18388* (2013.01); *H01S 5/4025* (2013.01)

(58) Field of Classification Search
   CPC .... G01S 7/4814; G01S 17/08; H01S 5/18388; H01S 5/4025
   See application file for complete search history.

(56) References Cited

U.S. PATENT DOCUMENTS

| 5,081,639 | A | 1/1992 | Snyder et al. |
| 7,420,691 | B2 | 9/2008 | Fukui |
| 7,557,906 | B2 | 7/2009 | Mack |
| 9,575,184 | B2 * | 2/2017 | Gilliland ................. G01S 7/484 |

(Continued)

FOREIGN PATENT DOCUMENTS

| CN | 202305446 U | 7/2012 |
| JP | 2008-032707 A | 2/2008 |

(Continued)

OTHER PUBLICATIONS

Hao-Lin Chen, D. Francis, T. Nguyen, Wupen Yuem, Gabriel Li and C. Chang-Hasnian, "Collimating diode laser beams from a large-area VCSEL-array using microlens array," in IEEE Photonics Technology Letters, vol. 11, No. 5, pp. 506-508, May 1999, doi: 10.1109/68.759380. (Year: 1999).*

(Continued)

*Primary Examiner* — Isam A Alsomiri
*Assistant Examiner* — Sanjida Naser
(74) *Attorney, Agent, or Firm* — Sughrue Mion, PLLC

(57) ABSTRACT

Provided are light sensing systems and electronic apparatuses including the light sensing systems. The light sensing system includes a light source unit having a slit-shaped opening and configured to emit light through a slit-shaped opening; and a lens integrated with the light source unit on a surface of the light source unit on which the slit-shaped opening is formed. The lens is configured to make light emitted through the slit-shaped opening into a point light source at a far-field.

20 Claims, 11 Drawing Sheets

(51) Int. Cl.
*G01S 17/08* (2006.01)
*H01S 5/02253* (2021.01)
*H01S 5/183* (2006.01)

(56) References Cited

U.S. PATENT DOCUMENTS

| | | | |
|---|---|---|---|
| 10,199,801 B2* | 2/2019 | Li | H01S 5/423 |
| 11,275,155 B1* | 3/2022 | Phillips | G01S 7/4816 |
| 2011/0183450 A1 | 7/2011 | Suzuki et al. | |
| 2016/0248227 A1 | 8/2016 | Koyama et al. | |
| 2017/0051883 A1* | 2/2017 | Raring | H01S 5/02224 |
| 2017/0123218 A1 | 5/2017 | Stigwall et al. | |
| 2019/0317195 A1* | 10/2019 | Sun | G01S 7/4811 |
| 2021/0157008 A1* | 5/2021 | Schwarz | G01S 7/4817 |

FOREIGN PATENT DOCUMENTS

| | | | |
|---|---|---|---|
| JP | 4773329 B2 | 9/2011 | |
| JP | 2012-049180 A | 3/2012 | |
| KR | 10-2008-0100118 A | 11/2008 | |
| KR | 10-1687994 B1 | 12/2016 | |
| WO | WO-2014175901 A1 * | 10/2014 | H01S 5/183 |

OTHER PUBLICATIONS

Yongqi Fu and N. K. A. Bryan, "A novel one step integration of edge-emitting laser diode with micro-elliptical lens using focused ion beam direct deposition," in IEEE Transactions on Semiconductor Manufacturing, vol. 15, No. 1, pp. 2-8, Feb. 2002, doi: 10.1109/66.983438. (Year: 2002).*

Zhen-Nan Tian, Li-Jie Wang, Qi-Dai Chen, Tong Jiang, Li Qin, Li-Jun Wang, and Hong-Bo Sun, "Beam shaping of edge-emitting diode lasers using a single double-axial hyperboloidal micro-lens," Opt. Lett. 38, 5414-5417 (Year: 2013).*

V. Bardinal et al., "Spotted Custom Lenses to Tailor the Divergence of Vertical-Cavity Surface-Emitting Lasers," in IEEE Photonics Technology Letters, vol. 22, No. 21, pp. 1592-1594, Nov. 1, 2010, doi: 10.1109/LPT.2010.2071861. (Year: 2010).*

Nakahama et al., "Lateral integration of MEMS VCSEL and slow light amplifier boosting single mode power", IEICE Electronics Express, vol. 9, No. 6, Mar. 25, 2012, pp. 544-551 (8 pages total).

Gu et al., "Giant and High-resolution Beam-steering from Slow Light Amplifier with Bragg Reflector Waveguide", IQEC/CLEO Pacific Rim Aug. 28-Sep. 1, 2011, pp. 336-338 (3 pages total).

Kondo et al., "Fan-beam steering device using a photonic crystal slow-light waveguide with surface diffraction grating", Optic Letters, vol. 42, No. 23, Nov. 29, 2017, pp. 4990-4993 (4 pages total).

Gu et al., "Giant and high-resolution beam steering using slow-light waveguide amplifier", Optics Express, vol. 19, No. 23, Oct. 26, 2011, pp. 22675-22683, (9 pages total).

Communication dated Jul. 17, 2023, issued by the Korean Intellectual Property Office in Korean Patent Application No. 10-2018-0078306.

Office Action dated Jan. 19, 2024 by the Korean Patent Office in corresponding KR Patent Application No. 10-2018-0078306.

* cited by examiner

LIGHT SENSING SYSTEM AND ELECTRONIC APPARATUS INCLUDING THE SAME

CROSS-REFERENCE TO RELATED APPLICATION

This application claims priority from Korean Patent Application No. 10-2018-0078306, filed on Jul. 5, 2018 in the Korean Intellectual Property Office, the disclosure of which is incorporated herein in its entirety by reference.

BACKGROUND

1. Field

The present disclosure relates to light sensing systems and electronic apparatuses including the light sensing systems.

2. Description of the Related Art

Sensing technologies, such as radars, have been developed to determine a distance, location, shape, etc. of an object based on information obtained from electromagnetic waves reflected by the object or a terrain within a detection range. Such sensing technologies have been used for detecting a position of an aircraft, estimating precipitation, measuring the depth of water, etc. for military and aviation applications. Recently, as one of these technologies, a lidar (also known as light detection and ranging (LiDAR)) system has drawn attention for detecting a distance, direction, velocity, temperature, material distribution, and concentration characteristic of an object by irradiating a laser as a pulse signal having high energy density to the object.

Laser technology has advanced remarkably since the 1970s and has been used for earth aeroscopy by mounting a laser device on an artificial satellite or an aircraft. Also, the laser technology has been applied to a LiDAR system for measuring a long distance, a vehicle speed, etc. on the ground. Recently, as a core technology of a laser scanner and a 3D image camera for an autonomous vehicle, the utilization and importance of laser technology have greatly increased.

Regarding the LiDAR system, the intensity of light returning to the LiDAR system after being reflected by an object is reduced due to light scattering, and thus, an additional optical element, such as a lens for collecting light, may be required. Therefore, a high-power light source and a light receiving element may be required. Especially, a scanning beam that is linearly emitted may be plagued by the intensity of light that is further reduced per unit point, and thus, a high-power light source that collects the emitted light to a point may be necessary for sensing an object at a long distance. In order to change a light source that emits linear light to a point light source, it is necessary to use an external optical system, such as an auxiliary lens. In this case, a focal point of light may change according to an angle of a beam entering the lens, and also, a loss of beam may occur while the beam is passing through the optical part.

SUMMARY

Provided are light sensing systems that do not require an additional external lens for forming a point light source and electronic apparatuses including the light sensing systems.

Additional aspects will be set forth in part in the description which follows and, in part, will be apparent from the description, or may be learned by practice of the presented embodiments.

According to an aspect of an example embodiment, a light sensing system may include: a light source having a slit-shaped opening and configured to emit light through the slit-shaped opening; and a lens integrated with the light source on a surface of the light source on which the slit-shaped opening is formed and configured to emit the light through the slit-shaped opening as a point light source at a far-field.

The light source may include an active optical element having an active layer. The slit-shaped opening may be formed in the active optical element. The lens may be formed on a surface of the active optical element in which the slit-shaped opening is formed.

The light source may further include a separated light source. The active optical element may be configured to operate as an amplifier to amplify and output the light incident on the active optical element from the light source while the light is transmitted through the active optical element.

The active optical element may be configured to generate the light.

The active optical element may include: a light-emitting region where the light is generated; and an amplifying region where the light, which is generated from the light-emitting region and travelling through the amplifying region, is amplified and outputted. The slit-shaped opening may be formed on the amplifying region.

The lens may be configured as a single structure on the slit-shaped opening to form a single point light source with respect to the slit-shaped opening.

The lens may include a cylindrical lens configured to focus light dispersed with respect to a slit width of the slit-shaped opening.

Units each including the light source and the lens are one-dimensionally or two-dimensionally arranged to form a plurality of point light sources arranged one-dimensionally or two-dimensionally.

A plurality of lenses spaced apart from each other may be formed on the slit-shaped opening in a length direction of a slit to form a plurality of point light sources with respect to the slit-shaped opening.

The lens may include cylindrical lenses or convex lenses arranged separately from each other in the length direction of the slit on the slit-shaped opening so that the cylindrical lenses or the convex lenses form the plurality of point light sources with respect to the slit-shaped opening.

Units each including the light source and the plurality of lenses formed with respect to the slit-shaped opening of the light source may be repeatedly one-dimensionally arranged to form the plurality of point light sources in a two-dimensional arrangement.

Units, each including the light source and the lens, may be repeatedly arranged, and each lens in the units may be provided so that so that beams of light respectively emitted from each light source of the units have multiple emission angles.

According to an aspect of an embodiment, a lidar apparatus may include: a light sensing system that includes: a light source having a slit-shaped opening and configured to emit light through the slit-shaped opening, a lens integrated with the light source on a surface of the light source on which the slit-shaped opening is formed, and configured to emit the light through the slit-shaped opening as a point light source at a far-field, and a light receiver configured to receive the light that is emitted from the light source towards an object, focused or collimated by the lens, and reflected by the object; and a processor configured to control the light sensing system and to analyze the light received from the light sensing system.

The light source of the light sensing system may include an active optical element having an active layer. The slit-shaped opening may be formed in the active optical element. The lens is formed on a surface of the active optical element in which the slit-shaped opening is formed.

The active optical element may be configured to perform as at least one of (i) an amplifier to transmit, amplify, and output the light incident on the active optical element from the light source and (ii) the light source to generate the light.

The light sensing system may include a cylindrical lens formed as a single structure with the slit-shaped opening and configured to focus light that disperses with respect to a slit width of the slit-shaped opening to form a single point light source with respect to a single slit-shaped opening.

In the light sensing system, a plurality of point light sources arranged one-dimensionally or two-dimensionally may be formed by repeatedly one-dimensionally or two-dimensionally arranging units each comprising the light source and the lens.

In the light sensing system, a plurality of point light sources may be formed with respect to a single slit-shaped opening by separately arranging a plurality of lenses in a length direction of a slit on the slit-shaped opening.

The lens may include cylindrical lenses or convex lenses separately arranged in the length direction of the slit on the slit-shaped opening so that the plurality of point light sources are formed with respect to the single slit-shaped opening.

A plurality of point light sources having a two-dimensional arrangement may be formed by repeatedly one-dimensionally arranging units each including the light source and the plurality of lenses formed with respect to the slit-shaped opening of the light source.

The light sensing system may realize a point light source at a far-field by forming a lens as one body with the slit-shaped opening of the light source, and thus, a high power light having high efficiency may be emitted when an object is sensed with light.

The light sensing system may be applied to various optical apparatuses or electronic apparatuses, and, for example, information of an object may be obtained by being applied to a LiDAR system.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
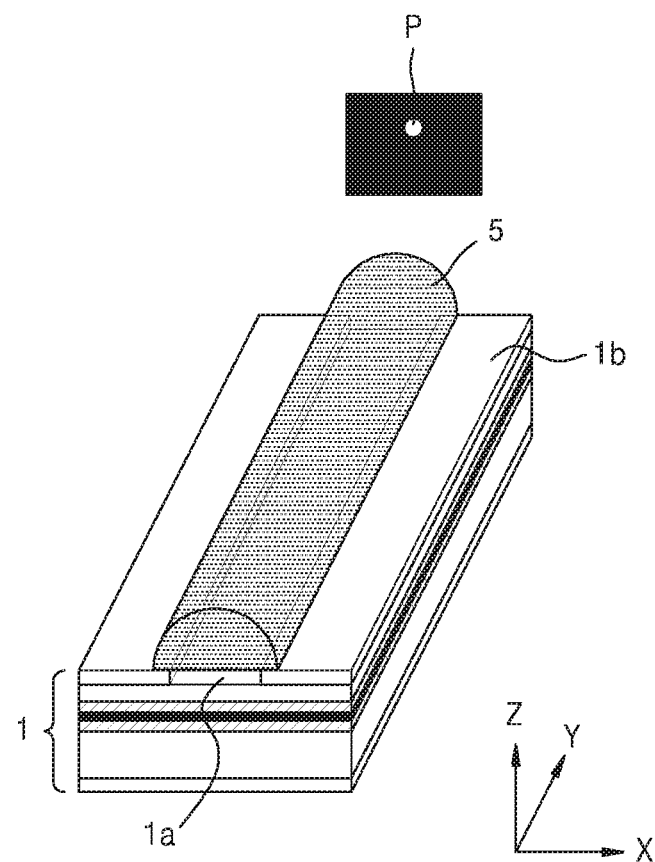
FIG. 1 is a schematic perspective view of a light sensing system according to an example embodiment.

Light sensing systems according to example embodiments and electronic apparatuses including the light sensing systems will now be described with reference to the accompanying drawings. In the drawings, like reference numerals refer to equal or like elements throughout, and sizes and thicknesses of constituent elements may be exaggerated for explanation convenience. In this regard, the present embodiments may have different forms and should not be construed as being limited to the descriptions set forth herein.

The light sensing systems according to the embodiments may be applied to, for example, a light transmitter or a light transceiver of a light detection and ranging (LiDAR) sensor, and the electronic apparatuses may be, for example, LiDAR apparatuses.

A LiDAR sensor may include a light transmitter, a light receiver, a signal collector, and a data processor. A measuring method used by the LiDAR sensor may be a time-of-flight (TOF) method, by which a distance is measured based on a time difference of a light pulse signal, for example, a reflected signal of a laser pulse signal that arrives at the light receiving unit, and a phase-shift method, in which the amount of reflection phase change of a laser beam modulated to a specific frequency is measured.

When the LiDAR sensor includes a silicon-based phase array device, for example, a Si or $Si_3N_4$ phase array device that uses a silicon photonics technique compatible with a semiconductor complementary metal-oxide-semiconductor (CMOS), the light source unit of the LiDAR sensor may include a laser input unit, a beam branching unit, a phase modulation unit, and an output unit. In this case, a light sensing system to which light of a single wavelength light is input may be able to one-dimensionally (1D) steer the light by phase modulation thereof in a direction (for example, a perpendicular direction) that is not parallel to a waveguide direction of an output-end (e.g., opening). Also, the light sensing system may be able to steer the light in a horizontal direction parallel to a waveguide of the output-end by sequentially inputting laser lights of various wavelengths. Thus, a two-dimensional (2D) scanning is possible by using a phase modulation method together with a wavelength modulation method. Additionally, a wavelength of laser may be change in time using a tunable laser diode.

Also, a direct light source method in which a laser device, such as a laser diode or a surface emitting laser diode is used as a direct light source, may be used with a LiDAR apparatus via a flash method in which a plurality of light sources are simultaneously emitted to a front side instead of scanning a point light source. These methods also require the use of a photodiode in a light receiver to detect reflected light that is emitted from a light source and is reflected by an object. The photodiode is an element that detects the intensity of light by changing light into an electric signal, and may be a generic photodiode. Besides, in order to detect light of low intensity, the photodiode may be an avalanche diode or a single-photon avalanche diode (SPAD) array.

In the light sensing system according to an embodiment, when light is linearly emitted from a semiconductor light source or an element in which a light amplifier integrated with a light source or the light amplifier and the light source are separated by a slit-shaped output-end, the light sensing system may change the light beam into a point light source. Light dispersed from a linear type output-end is focused at a far-field in a long-width direction (a vertical direction) of the output-end and has a shape widely scattering in a narrow-gap direction (a horizontal direction), and thus, is changed into a linear beam. Accordingly, for example, when cylindrical lenses are directly integrated at the output-end, the light sensing system may change the linear type beam into a point type beam by collecting light emitted to the outside in the horizontal direction.

FIG. 1 is a schematic perspective view of a light sensing system according to an example embodiment.

Referring to FIG. 1, the light sensing system may include a light source unit 1 having a slit-shaped output-end 1a (hereinafter, a slit-shaped output-end 1a), and a lens 5 integrated with the light source unit 1 on a surface 1b of the light source unit 1 on which the slit-shaped output-end 1a of the light source unit 1 is formed. The light source unit 1 may emit light through the slit-shaped output-end 1a, and the lens 5 may change the light emitted through the slit-shaped output-end 1a into point light at a far-field.

The light source unit 1 may include a light source or an amplifier configured to transmit light incident from the light source and to output amplified light. The slit-shaped output-end 1a may be formed on the light source unit 1, and the lens 5 may be formed on the surface 1b of the light source unit 1 on which the slit-shaped output-end 1a of the light source unit 1 is formed.

For example, the slit-shaped output-end 1a may be formed to have slit shape on a layer of the light source unit 1, for example, an upper electrode 19 (refer to FIG. 9A) which will be described below. Also, the slit-shaped output-end 1a may be formed on another layer located on the upper electrode 19 instead of the upper electrode 19 of the light source unit 1. Light passing through a narrow width may be dispersed due to the phenomenon of diffraction.

Accordingly, a beam is not dispersed in a slit-length direction (a y-axis direction) of the slit-shaped output-end 1a, but the beam is widely dispersed in a slit-width direction (an x-axis direction) crossing the slit-length direction. Thus, when the beam is viewed in a far-field, a linear beam may be formed in the slit-width direction.

In the light sensing system according to an embodiment, the lens 5 integrated with the light source unit 1 is formed on a surface of the light source unit 1 on which the slit-shaped output-end 1a is formed. Thus, light emitted through the slit-shaped output-end 1a may be collected at a far-field by the lens 5 and may be formed as a point light.

As depicted in FIG. 1, the lens 5 may be provided as a single structure with the slit-shaped output-end 1a of the light source unit 1. In this case, a single point light source may be formed with respect to the single slit-shaped output-end 1a. In FIG. 1, a white point in a black box on an upper side of FIG. 1 may correspond to a point light source P focused at a far-field by the lens 5.

At this point, as depicted in FIG. 1, the lens 5 may include a cylindrical shape lens to focus light that is dispersed with respect to the slit-width of the slit-shaped output-end 1a.

As depicted in FIG. 1, the light source unit 1 integrated with the lens 5 may readily change a linear beam into point light P, and thus, an additional external lens is unnecessary. Also, since the light source unit 1 may focus output light onto a point, a high output light source may be realized, the size and position of the light source unit 1 and the light receiving unit may be freely configured according to required applications, and when the light source unit 1 is used for a light sensor like a LiDAR sensor, optical elements, such as a lens for focusing light is unnecessary, and thus, a LiDAR apparatus of a small size may be realized.

Figure 2:
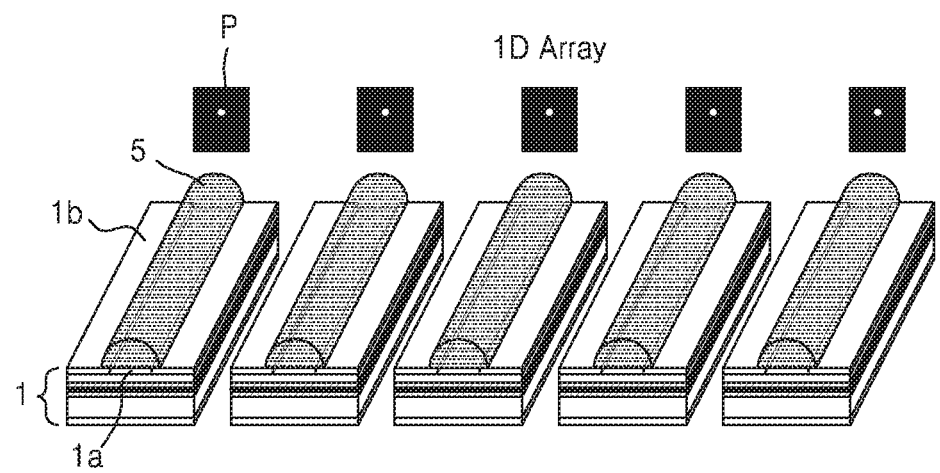
FIGS. 2 through 6 are schematic perspective views of light sensing systems according to various example embodiments.

FIG. 2 is a schematic perspective view of a light sensing system according to another example embodiment. The light sensing system of FIG. 2 shows a case in which a plurality of one-dimensionally (1D) arranged point light sources P are formed by repeatedly one-dimensionally arranging units each including the light source unit 1 having the lens 5 as a single structure on the slit-shaped output-end 1a and the lens 5.

Figure 3:
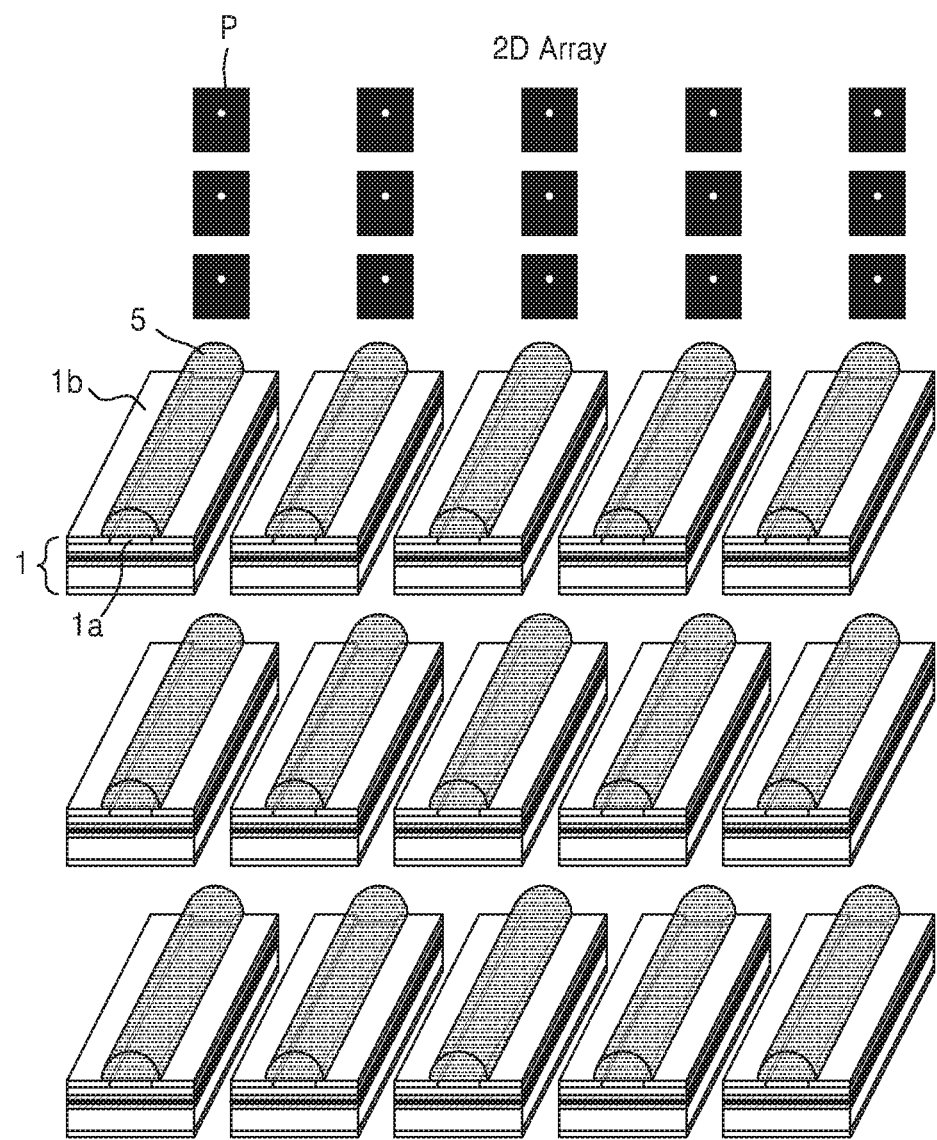

FIG. 3 is a schematic perspective view of a light sensing system according to another example embodiment. FIG. 3 shows a light sensing system that includes a plurality of two-dimensionally (2D) arranged point light sources P formed by repeatedly arranging units two-dimensionally, each unit including the light source unit 1 having the lens 5 as a single structure on the slit-shaped output-end 1a and the lens 5.

As depicted in FIGS. 2 and 3, when the units, each including the lens 5 and the light source unit 1 having the lens 5 as a single structure on the surface 1b of the light source unit 1 on which the slit-shaped output-end 1a is formed, are repeatedly arranged in a one-dimensional or two-dimensional arrangement, a plurality of point light sources P that are one-dimensionally or two-dimensionally arranged may be formed.

Figure 4:
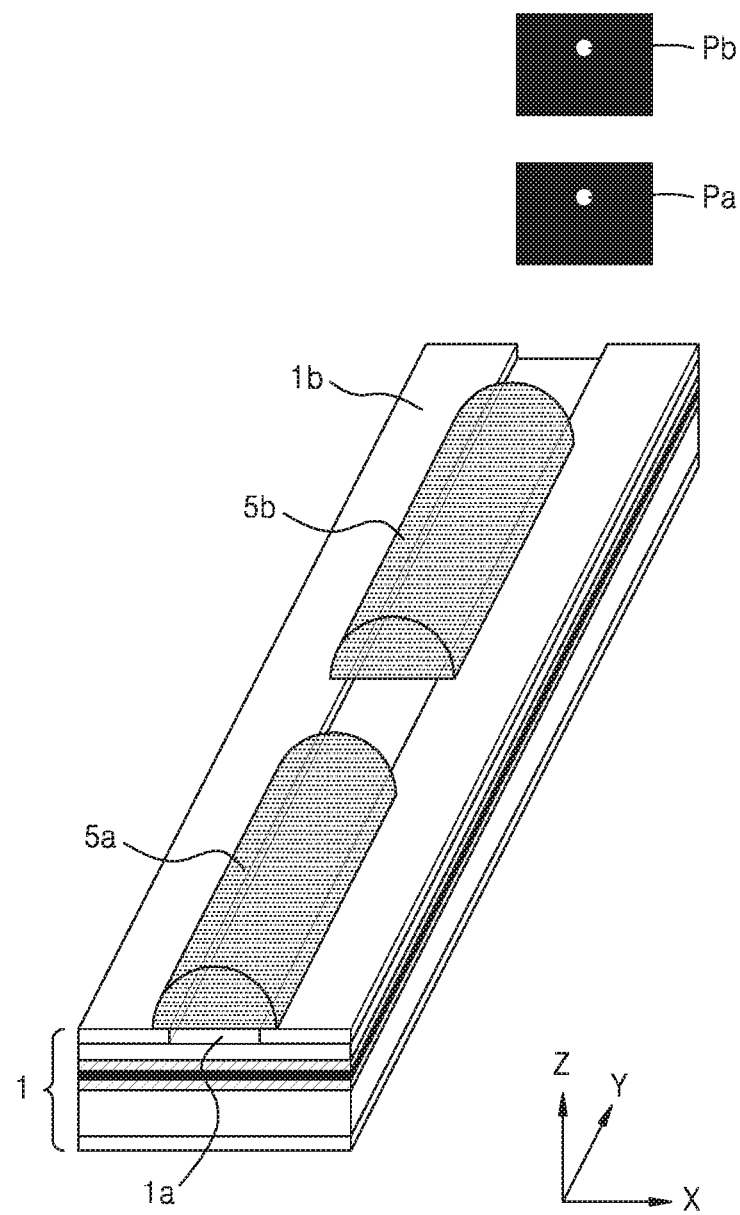

FIG. 4 is a schematic perspective view of a light sensing system according to another example embodiment. FIG. 4 shows a plurality of point light sources P that are formed with respect to a single slit-shaped output-end 1a obtained by forming a slit shape lens on a predetermined layer, for example, an upper electrode of the light source unit 1 by separately arranging a plurality of lenses 5 in a length direction (y-axis direction) of the slit. As an example, FIG. 4 shows a case in which two point light sources Pa and Pb are formed with respect to the single slit-shaped output-end 1a by separately arranging two cylindrical lenses 5a and 5b in a length direction of the slit.

Figure 5:
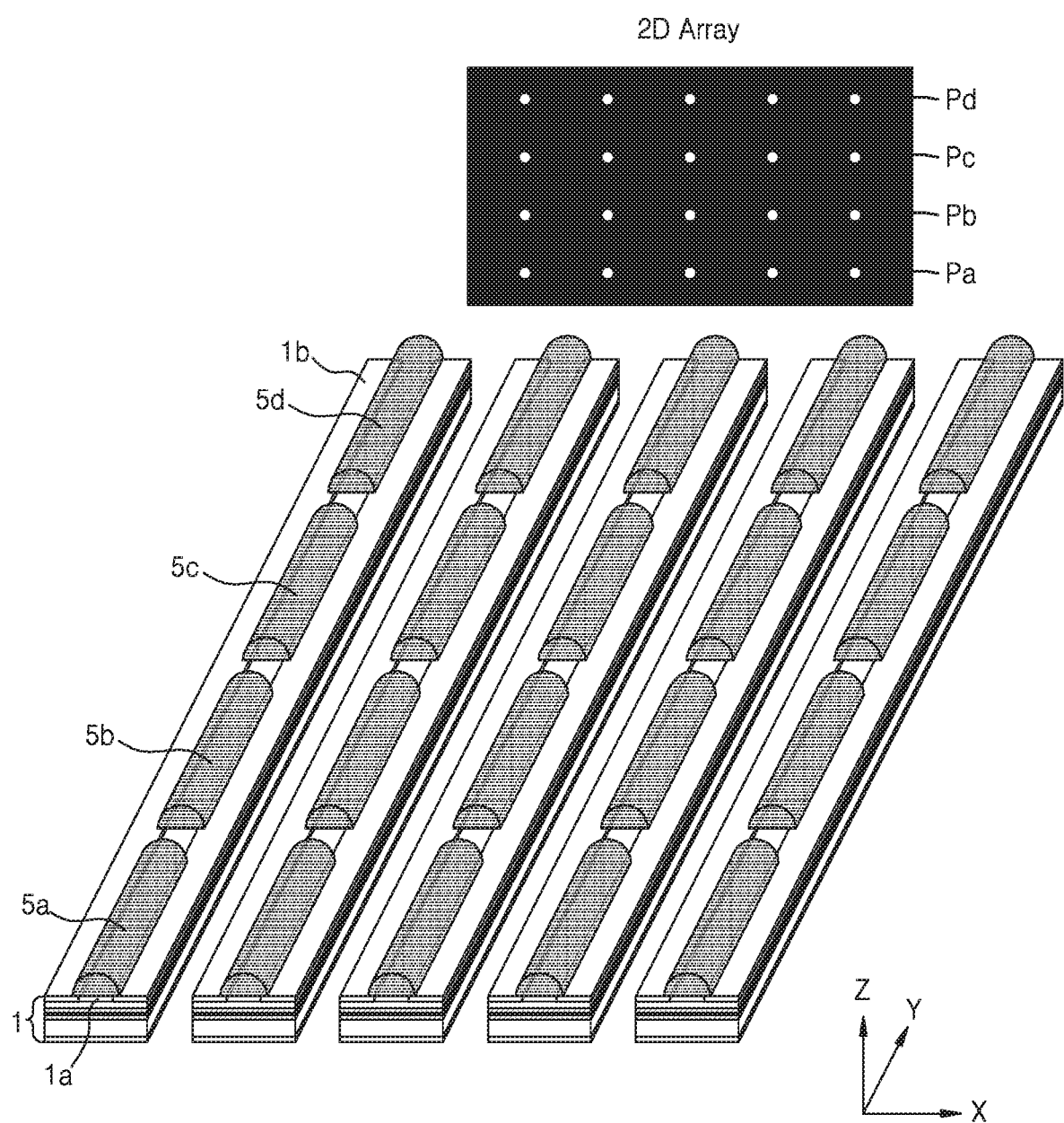

FIG. 5 is a schematic perspective view of a light sensing system according to another example embodiment. FIG. 5 shows a plurality of point light sources, which have a repeated one-dimensional arrangement, that is, a two-dimensional arrangement of the point light sources P, are formed by repeatedly and one-dimensionally arranging units, each including the light source unit 1 having the slit-shaped output-end 1a obtained by forming a narrow and long slit shape in a predetermined layer, for example, the upper electrode and a plurality of lenses 5 formed with respect to the slit-shaped output-end 1a of the light source unit 1. FIG. 5 shows a plurality of point light sources that have a two-dimensional arrangement and are formed by one-dimensionally arranging units that form four point light sources Pa, Pb, Pc, and Pd by separately arranging four cylindrical lenses 5a, 5b, 5c, and 5d with respect to the light source unit 1 and the slit-shaped output-end 1a of the light source unit 1 in a length direction (y-axis direction) of the slit.

In FIG. 4, as an example, it is depicted that the lenses 5 separately arranged in the length direction of the slit are cylindrical lenses 5a and 5b. However, as depicted in FIG. 6, the lenses 5 may be convex lenses 5a', 5b', and 5c' instead of the cylindrical lenses 5a and 5b.

Figure 6:
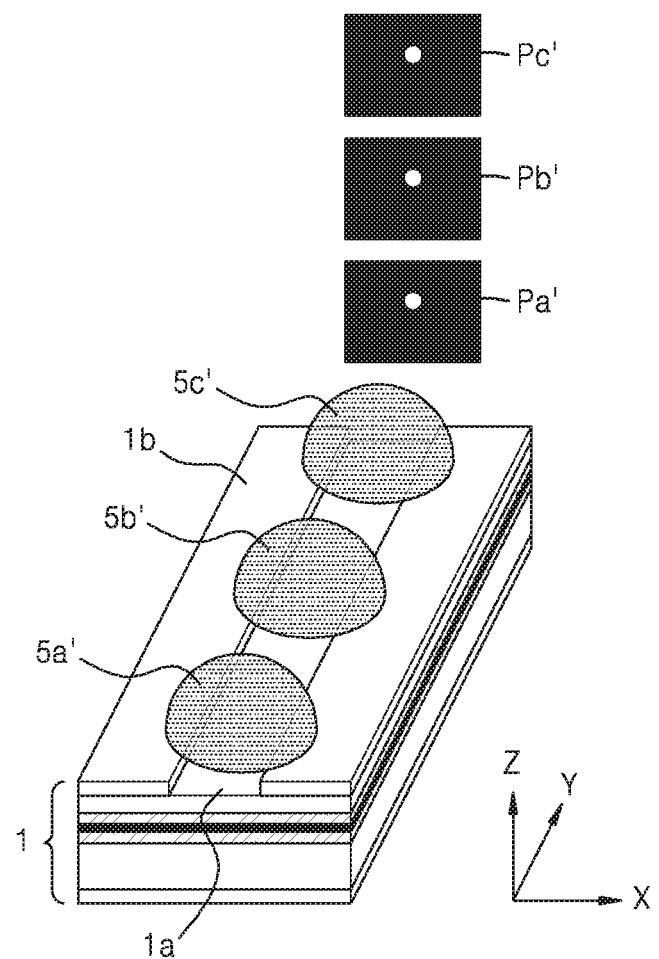

As an example, FIG. 6 shows three point light sources Pa', Pb', and Pc' that are formed at a far-field by arranging the three convex lenses 5a', 5b', and 5c' in the length direction (y-axis direction) of the slit with respect to the single slit-shaped output-end 1a. However, the number of convex lenses 5a', 5b', and 5c' formed with respect to the single slit-shaped output-end 1a may be variously changed. Also, a plurality of point light sources having a 2D arrangement may be formed by repeatedly and one-dimensionally arranging a unit of the light source unit 1 in which a plurality of the convex lenses 5a', 5b', and 5c' are arranged in the length direction of the slit with respect to the single slit-shaped output-end 1a as in FIG. 5.

As in FIGS. 4 through 6, in the case of a structure in which a plurality of lenses are separately formed only on a region of the slit-shaped output-end 1a, a portion of output light may be changed to a point light source, and, also in this case, an external lens is not needed, and the control of a beam emission direction and a beam shape may be readily realized.

Referring to FIGS. 2 through 6, an emission angle of light focused or collimated by a plurality of lenses is not defined. However, each of the lenses 5 formed on the slit-shaped output-end 1a of the light source unit 1 may be provided to change different emission angles of light emitted from the light source unit 1.

Figure 7:
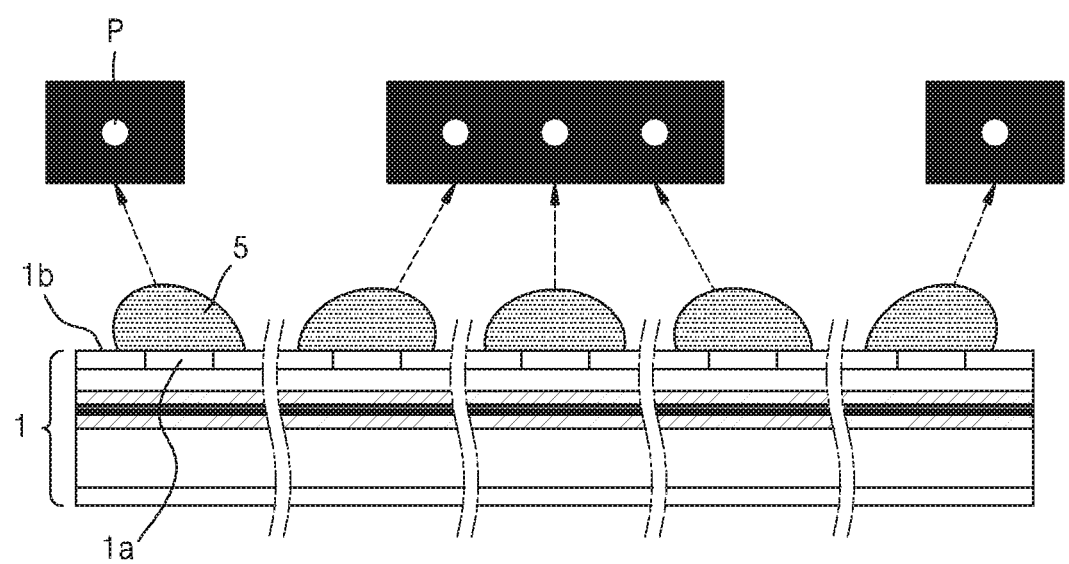
FIG. 7 is a schematic cross-sectional view of a light sensing system according to another example embodiment.
Figure 8A:
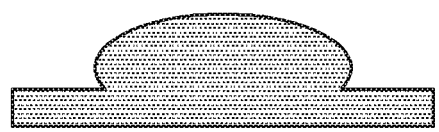
FIGS. 8A through 8E show various shapes of lenses integrated with a light source unit of a light sensing system according to an example embodiment.
Figure 8B:
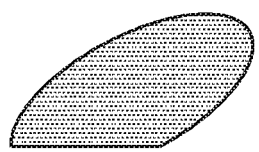
Figure 8C:
Figure 8D:
Figure 8E:

FIG. 7 is a schematic cross-sectional view of a light sensing system according to another example embodiment. As an example, FIG. 7 shows a case in which the lenses 5 have shapes for controlling emission angles in different directions according to a relative position of each of the light source units 1, and thus, the formation position of the point light sources P may be directed to desired directions.

In the light sensing systems according to the example embodiments described with reference to FIGS. 1 through 7, the lens 5 integrated with the light source unit 1 may include a material, such as polymer, glass, etc. having low light absorption. For example, the lens 5 integrated with the light source unit 1 may be formed such that a pattern is formed by using a polymer material, such as a photosensitive polymer, and then, the pattern may be formed as a lens shape through annealing the pattern. Also, the lens 5 may be formed by etching a pattern of double films, but the manufacturing of the lens 5 is not limited thereto. Also, the shape and width of the lens 5, for example, a cylindrical lens, may be determined according to an emission angle of light to be collected, and a plurality of point light sources P may be formed by integrating the lenses 5 with the light source unit 1 only on a portion of the slit-shaped output-end 1a. Also, each of the lenses 5 may be of types different from each other according to required directions and emission angles.

In the above description, the lenses 5 formed on the slit-shaped output-end 1a of the light source unit 1 may be cylindrical lenses or convex lenses. However, the shapes of the lenses 5 are not limited thereto, and the shapes of the lenses 5 may be changed according to the shape of the point light sources P to be formed.

In the light sensing system according to an embodiment, for example, as depicted in FIGS. 8A through 8E, the shape of the lens 5 may be changed to various shapes according to the point light sources P that are to be formed, for example, circular point light sources, oval point light sources, etc. FIGS. 8A through 8E show various shapes of lenses 5 to be formed as one-body with the light source unit 1 of a light sensing system according to an example embodiment.

In addition, FIGS. 2, 3, and 5 depict each of the light source units 1 as being arranged to form an array, but a light source unit array may be formed on a single substrate.

The light source unit 1 integrated with the lens 5 may be an active optical element, such as a laser diode, a vertical cavity surface emitting laser (VCSEL), a semiconductor optical amplifier, etc. At this point, the light source unit 1 may include a group III-V semiconductor material, a group II-VI semiconductor material, a group IV semiconductor material, etc., but the materials are not limited thereto. Also, a photo-crystal and a wave guide having a grating structure etc. may be applied to the light source unit 1 integrated with the lens 5.

Figure 9:
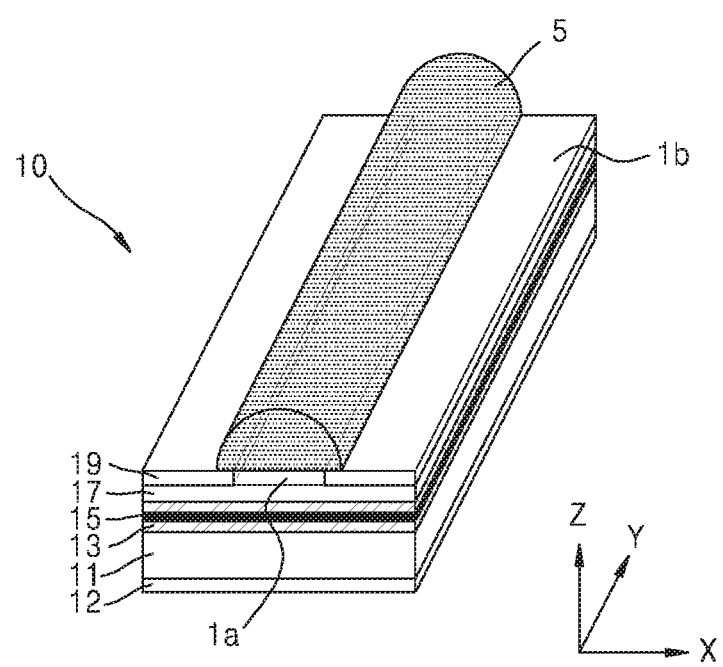
FIGS. 9 through 11 show examples of light source units.
Figure 10:
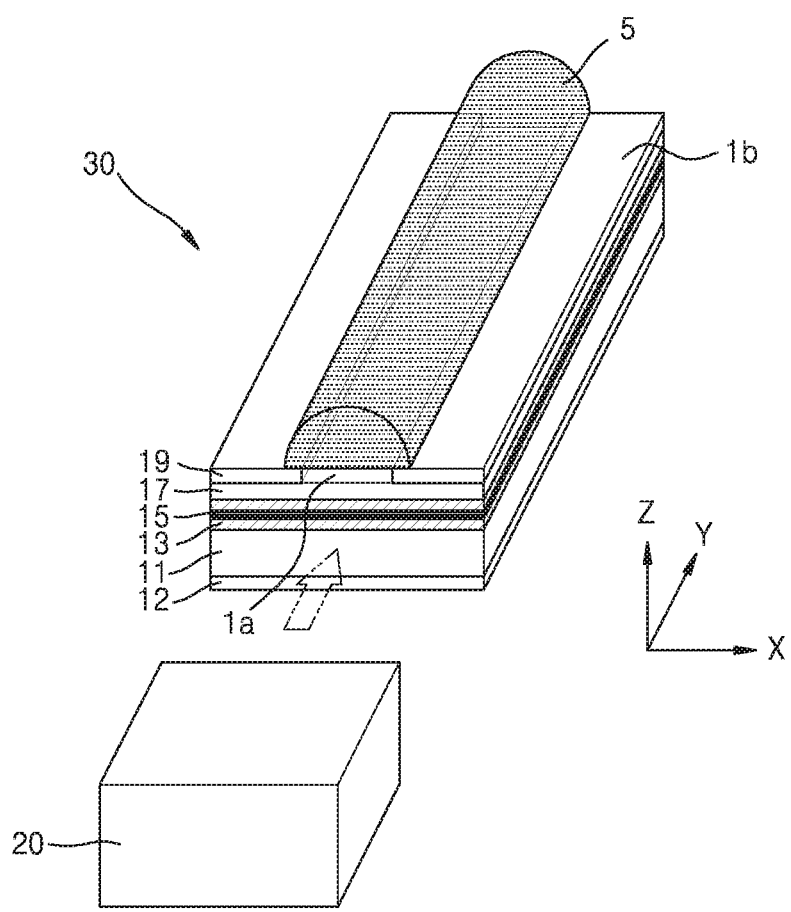
Figure 11:
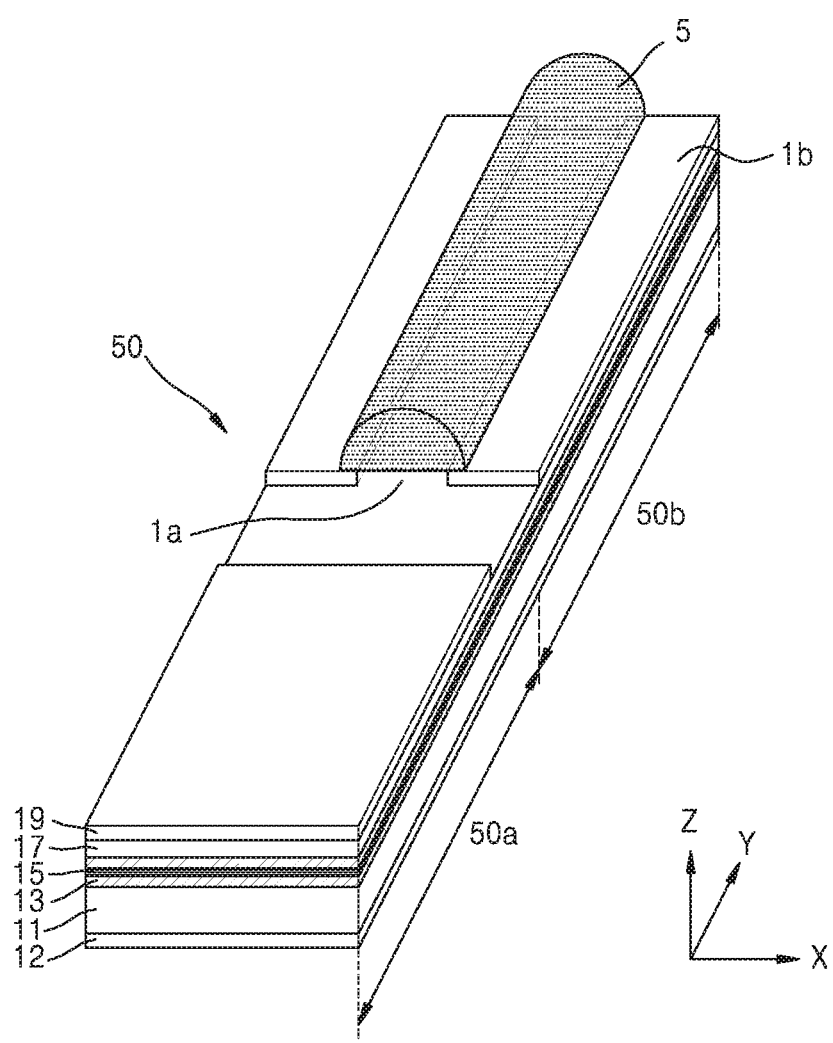

FIGS. 9 through 11 show examples of light source units. The light source units of FIGS. 9 through 11 may be applied to the light source unit 1 of the light sensing system according to the embodiments described with reference to FIGS. 1 through 7. FIGS. 9 through 11 show the cases that the lens 5 is formed on the surface 1b of the light source unit on which the slit-shaped output-end 1a of the light source unit is formed. In FIGS. 9 through 11, as an example, the lens 5 formed on the slit-shaped output-end 1a of the light source unit is a single structure cylindrical lens, and as described above, the lens 5 may include a plurality of various shape lenses separated from each other in the length direction of the slit. FIG. 9 through 11 show the surface 1b of the light source unit, on which the slit-shaped output-end 1a is formed, and the surface 1b corresponds to an upper electrode 19, but the slit-shaped output-end 1a may be formed in a predetermined layer above the upper electrode 19, and the lens 5 may be formed on a surface of the predetermined layer.

Referring to FIGS. 9 through 11, the light source units may include active optical elements 10, 30, and 50 each having an active layer 15.

FIG. 9 shows an example where the active optical element 10 of the light source unit is a light source that generates light. FIG. 10 shows an example where the active optical element 30 of the light source unit is an amplifier. In FIG. 10, the light source unit may include a separated light source 20 configured to generate light, and may include the active optical element 30 that performs as an amplifier that transmits, amplifies, and outputs light incident from the separated light source 20. FIG. 10 shows the separated light source 20 as an external light source separated from the active optical element 30. The external light source may include, for example, a VCSEL, a laser diode, or a light-emitting diode. FIG. 11 shows the active optical element 50 of the light source unit as including a light-emitting region 50a where light is generated and an amplifying region 50b where the light generated and travelling from the light-emitting region is amplified and outputted, that is, the light source and the amplifier are formed as one body.

Each of the active optical elements 10, 30, and 50 may include a first layer 13, the active layer 15, a second layer 17, and the upper electrode 19 on a substrate 11. A lower electrode 12 may be formed on a lower surface of the substrate 11 or on a side of the first layer 13. FIGS. 9 through 11 show an example where the lower electrode 12 is formed on the lower surface of the substrate 11.

In the light source unit according to an embodiment, the slit-shaped output-end 1a may be formed by forming a narrow slit in the upper electrode 19 of each of the active optical elements 10, 30, and 50. As depicted in FIG. 11, when the active optical element 50 includes the light-emitting region 50a and the amplifying region 50b, the slit-shaped output-end 1a may be formed in the upper electrode 19 on the amplifying region 50b of the active optical element 50.

The active layer 15 of the active optical elements 10, 30, and 50 may generate or amplify light. Also, the first layer 13 of the active optical elements 10, 30, and 50 may be a reflector layer, a photo-crystal, or a lower clad layer, and the second layer 17 may be, for example, a reflector layer, an upper clad layer, a photo-crystal, or a grating so that light is emitted through the slit-shaped output-end 1a formed in the upper electrode 19.

The active optical elements 10, 30, and 50 may include, for example, a VCSEL structure. In this case, the first layer 13 may be a lower Bragg reflector layer and the second layer 17 may be an upper Bragg reflector layer. At this point, the upper Bragg reflector layer has a smaller number of layer stacking than the lower Bragg reflector layer, and light may be generated or amplified in the active layer 15 by a current applied between the upper electrode 19 and the lower electrode 12 while the light resonates by the upper Bragg reflector layer and the lower Bragg reflector layer, and may be emitted to the outside through the second layer 17, for example, the upper Bragg reflector layer. The light generated or amplified by the active layer 15 of the active optical elements 10, 30, and 50 may be outputted through the slit-shaped output-end 1a provided in the upper electrode 19. For example, instead of the upper Bragg reflector layer as the second layer 17, an upper clad layer, a photo-crystal, a grating, etc. may be provided. Also, instead of the lower Bragg reflector layer as the first layer 13, a lower clad layer, a photo-crystal, etc. may be provided.

Meanwhile, as depicted in FIG. 9, when the active optical element 10 is a light source itself, or, as depicted in FIG. 11, when the active optical element 50 includes the light-emitting region 50a and the amplifying region 50b, the active optical elements 10 and 50 may be tunable elements that change a wavelength of generated light. Also, as depicted in FIG. 10, when the light sensing system includes the separated light source 20, a wavelength of light incident to the active optical element 30 may be changed by using a tunable light source, for example, a tunable laser as the separated light source 20. In this manner, when a wavelength of light generated in the active optical elements 10 and 50 is changed or a wavelength of light incident to the active optical element 30 is changed, a direction of beam steering may be changed according to a wavelength of light.

As described with reference to FIGS. 9 through 11, when a wavelength of light generated in the active optical elements 10 and 50 is changed or a wavelength of light incident to the active optical element 30 is changed, a beam steering may be performed according to a wavelength of light. Also, a 2D beam steering may be performed by arranging the light source units including the active optical elements 10, 30, and 50 as depicted in FIGS. 9 through 11.

As described with reference to FIGS. 9 through 11, when the slit-shaped output-end 1a is formed in the active optical elements 10, 30, and 50 of the light source unit 1, a beam emitted from the slit-shaped output-end 1a may have the same shape as the slit-shaped output end 1a at a position near the slit, but at a far-field, a linear beam may be emitted.

However, as in the embodiments, when the lens 5 is formed as one-body with the slit-shaped output-end 1a of the light source unit 1, beams are focused by the lens 5, and thus, a linear beam may be changed to a point light source at a far-field. For example, when dispersed light of an axis is collected by including a cylindrical lens at the slit-shaped output-end 1a, a point light source may be formed at a far-field. At this point, as described above, the shape of the point light source may be changed according to the shape of the lens.

As described above, the light sensing system according to an example embodiment may include the light source unit 1 and the lens 5 integrated with the slit-shaped output-end 1a of the light source unit 1. In addition, the light sensing system according to an example embodiment may further include a light receiving unit.

Figure 12:
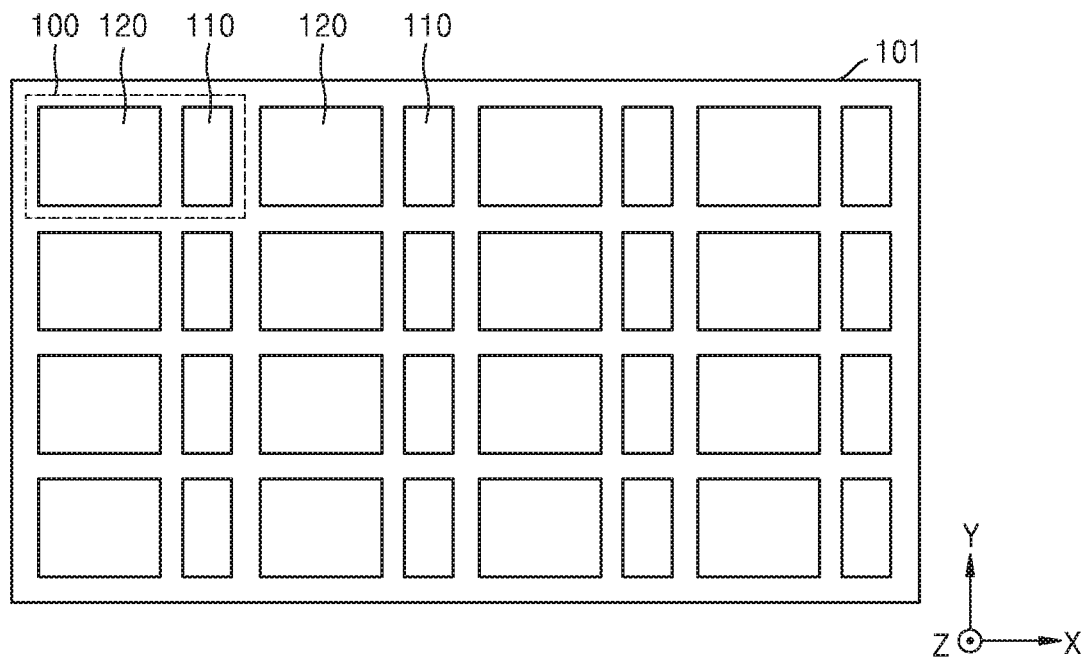
FIG. 12 is a plan view of a schematic configuration of a light sensing system according to an example embodiment.

FIG. 12 is a schematic plan view of a configuration of a light sensing system according to an embodiment, and the light sensing system includes both light source units 110 and light receiving units 120.

Referring to FIG. 12, the light sensing system may include a plurality of light source units 110 integrated with lenses and a plurality of light receiving units 120. As depicted in FIG. 12, the arrangement of the light source units 110 integrated with lenses and the light receiving units 120 may have a shape in which a plurality of light receiving-emitting units 100 are repeatedly arranged. The light receiving-emitting units 100 may include at least one light source unit 110 integrated with a lens and at least one light receiving unit 120. In FIG. 12, one light source unit 110 may be integrated with a lens and one light receiving unit 120 may constitute one light receiving-emitting unit 100, but this is merely an example, and the light receiving-emitting unit 100 according to an example embodiment is not limited thereto.

In order to realize the arrangement of the light sensing system, the plurality of the light source units 110 integrated with lenses and the light receiving units 120 may be formed as one body. The light source units 110 integrated with lenses and the light receiving units 120 may be monolithically integrated as one body on the same substrate 101. At this point, each of the light source units 110 integrated with lenses may have a structure in which, as described with reference to FIGS. 1 through 11, the light source unit 1 and the lens 5 in at the slit-shaped output end 1a of the light source unit 1 are formed as one body, and may be provided to form a point light source at a far-field by focusing or collimating light emitted through the slit-shaped output-end 1a of the light source unit 1 by the lens 5.

Figure 13:
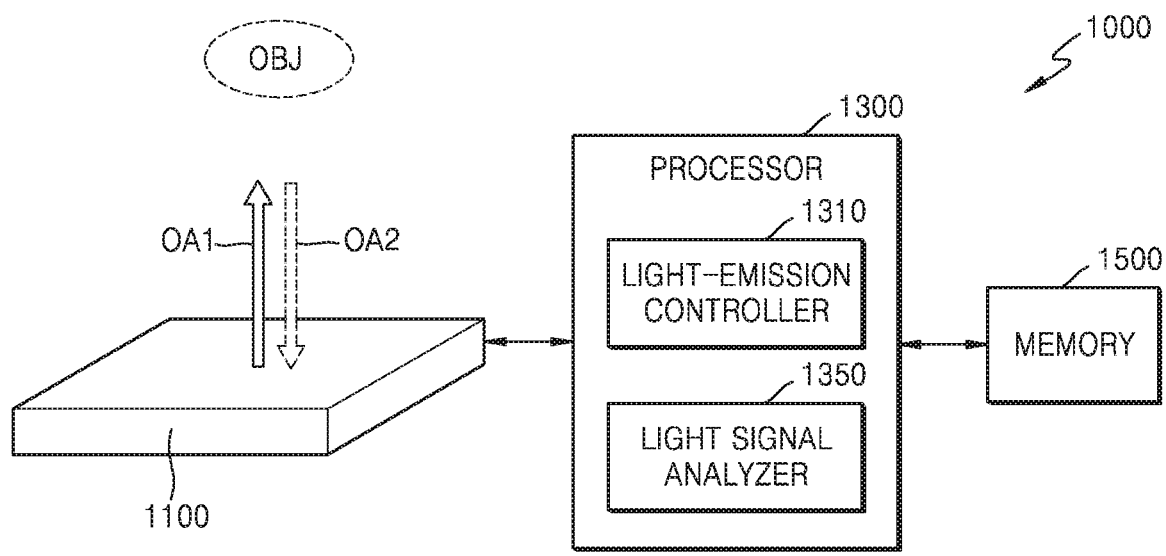
FIG. 13 is a block diagram of a schematic configuration of a LiDAR system according to an example embodiment.

FIG. 13 is a schematic block diagram showing a configuration of a LiDAR apparatus 1000 according to an embodiment.

The LiDAR apparatus 1000 may include a light sensing system 1100 and a processor 1300 that controls the light sensing system 1100 and analyzes light received from the light sensing system 1100.

The light sensing system 1100 may have a type of the light sensing systems according to the embodiments described above, or a combination or a modified system of these systems. The light sensing system 1100 may further include a light receiving unit in addition to the light source unit integrated with a lens.

The light sensing system 1100 includes light source units integrated with lenses, and may include the light source units integrated with lenses configured to irradiate point light towards an object OBJ, and light receiving units configured to receive light that is irradiated to and reflected from the object OBJ. In the light sensing system 1100, as depicted in FIG. 12, the light source units integrated with lenses may be arranged in an array, and corresponding to this arrangement, the light receiving units may be arranged in an array. The light source units integrated with lenses and the light receiving units may be monolithically integrated as one body. The arrangement of the light source units integrated with lenses and the light receiving units may be changed in various ways.

The light source unit integrated with a lens included in the light sensing system 1100 may generate light to be used for detecting a location and analyzing a shape of the object OBJ, and may emit light OA1 as a point light source at a far-field by a lens. The light source unit may generate light of a wavelength band, for example, light of a wavelength of an infrared ray band suitable for detecting a location and analyzing a shape of the object OBJ. Light sources of the light source units included in the light sensing system 1100 may provide light of wavelength bands different from each other. For example, the light sources may be wavelength tunable light sources.

The processor 1300 may control an overall operation of the LiDAR apparatus 1000, and may include a light-emission controller 1310 and a light signal analyzer 1350.

The light-emission controller 1310 may control a light source or an amplifier of a lens integrated light source unit of the light sensing system 1100. For example, the light-emission controller 1310 may perform a power supply control, an ON/OFF control, a control of generating a pulse wave PW or a continuous wave CW, etc. with respect to the light source, and may perform a power supply control, an ON/OFF control, etc. with respect to the amplifier. Also, the light-emission controller 1310 may control the light sensing system 1100 so that a plurality of light source units included in the light sensing system 1100 simultaneously emit light (flash type). Also, the light-emission controller 1310 may control the light sensing system 1100 so that a plurality of light source units included in the light sensing system 1100 emit light with a predetermined time sequence. When the light sensing system 1100 provides a plurality of lights having different wavelength bands, the light-emission controller 1310 may control the light sensing system 1100 so that the light sensing system 1100 provides lights having wavelength bands different from each other with a time sequence. Also, the light-emission controller 1310 may control the light sensing system 1100 so that a light source unit that emits light of a specific wavelength band is operated by selecting the light source unit among a plurality of light source units.

Since the light sensing system 1100 includes a light receiving unit configured to sense light reflected by an object OBJ, the light sensing system 1100 may receive light OA2 reflected by the object OBJ after emitting the light OA1 from the light sensing system. A received light signal may be used for analyzing the presence, location, shape, physical properties of the object OBJ.

The light signal analyzer 1350 may analyze the presence, location, shape, physical properties, etc. of the object OBJ by analyzing a light signal received by the light sensing system 1100 from the object OBJ. The light signal analyzer 1350 may perform, for example, a computation for measuring a TOF, and a determination of a 3D shape of the object OBJ from the computation result. The light signal analyzer 1350 may also analyze the type, component, concentration, and physical analysis of the object OBJ by using a Raman analysis method that detects a wavelength change by the object OBJ.

The light signal analyzer 1350 may use various computation methods. For example, a direct time measuring method obtains a distance by measuring a time of returning light reflected by the object OBJ after projecting the light to the object OBJ using a timer. A correlation method measures a distance from brightness of reflected light returning from the object OBJ after projecting pulse light to the object OBJ. In a phase delay measuring method, a phase difference of reflected light returning from an object OBJ after projecting light of a continuous wave, such as a sign wave is sensed, and the phase difference is converted to a distance.

The LiDAR apparatus 1000 may include a memory 1500 configured to store a program required for computation and other data.

The light signal analyzer 1350 may transmit a computation result, that is, information with respect to a shape, location, and physical properties of an object OBJ to other units. For example, the information may be transmitted to an autonomous driving device that requires information of a 3D shape, motion, location of the object OBJ. Also, the information may be transmitted to a medical device that uses physical information, for example, biometric information of the object OBJ. Also, other units to which the information is transmitted may be displays or printers that output the result. Besides above, the other units may be smart phones, mobile phones, personal digital assistants (PDAs), laptops, personal computers (PCs), and other mobile or non-mobile computing devices, but are not limited thereto.

The LiDAR apparatus 1000 may be used as a sensor that obtains 3D information in real-time with respect to an object in the front, and thus, may be applied to autonomous driving devices, for example, driverless vehicles, autonomous vehicles, robots, drones, etc., and may be applied to other small vehicles (e.g., bicycles, motorcycles, strollers, skateboards, etc.), human and animal auxiliary devices (e.g., sticks, helmets, clothes, accessories, watches, bags, etc.), Internet of Things (IoT) devices, and building security devices, etc.

While the embodiments of light sensing systems and electronic apparatuses including the same have been described in detail with reference to accompanying drawings, it will be understood by those of ordinary skill in the art that various changes in form and details may be made therein without departing from the spirit and scope of the disclosure. Therefore, the embodiments should be considered in descriptive sense only and not for purposes of limitation. The scope of the disclosure is defined not by the detailed description but by the appended claims, and all differences within the scope will be construed as being included in the disclosure.

What is claimed is:

1. A light sensing system comprising:
   a light source comprising an upper electrode, a lower electrode, and a slit-shaped opening, and configured to emit a linear light beam through the slit-shaped opening; and
   a lens that is provided on the upper electrode of the light source to cover the slit-shaped opening that is formed in the light source, extends in a length direction of the slit-shaped opening, and is configured to make the linear light beam traveled in the length direction of the slit-shaped opening and emitted through an output end of the slit-shaped opening as a point light at a far-field,
   wherein the lens has a half cylinder shape having two opposing flat semicircular bases, and a curve portion and a flat rectangular portion that oppose each other and are provided between the two opposing flat semicircular bases.

2. The light sensing system of claim 1, wherein the light source comprises an active optical element having an active layer,
   wherein the slit-shaped opening is formed in the active optical element, and
   wherein the lens is formed on a surface of the active optical element in which the slit-shaped opening is formed.

3. The light sensing system of claim 2, wherein the light source further comprises a separated light source, and
wherein the active optical element is configured to operate as an amplifier to amplify and output a light beam incident on the active optical element from the separated light source while the light beam is transmitted through the active optical element.

4. The light sensing system of claim 1, wherein the flat rectangular portion of the lens is directly mounted on the upper electrode of the light source, and the slit-shaped opening extends in a direction in which the flat rectangular portion extends between the two opposing flat semicircular bases.

5. The light sensing system of claim 2, wherein the active optical element comprises:
a light-emitting region where a light beam is generated; and
an amplifying region where the light beam, which is generated from the light-emitting region and travelling through the amplifying region, is amplified and outputted, and
wherein the slit-shaped opening is formed on the amplifying region.

6. The light sensing system of claim 1, wherein the lens is disposed directly above the slit-shaped opening to form a single point light source with respect to one slit-shaped opening.

7. The light sensing system of claim 6, wherein the lens comprises a cylindrical lens configured to focus light dispersed with respect to a slit width of the slit-shaped opening.

8. The light sensing system of claim 7, wherein units each comprising the light source and the lens are one-dimensionally or two-dimensionally arranged to form a plurality of point light sources arranged one-dimensionally or two-dimensionally.

9. A light sensing system comprising:
a light source having a slit-shaped opening and configured to emit a linear light beam through the slit-shaped opening; and
a lens that is integrated with the light source on a surface of the light source on which the slit-shaped opening is formed, extends in a length direction of the slit-shaped opening, and is configured to make the linear light beam emitted through an output end of the slit-shaped opening as a point light at a far-field,
wherein a plurality of lenses that comprise the lens and are spaced apart from each other, are formed on the slit-shaped opening in the length direction of the slit-shaped opening to form a plurality of point light sources with respect to the slit-shaped opening.

10. The light sensing system of claim 9, wherein the plurality of lenses comprise cylindrical lenses or convex lenses separately arranged from each other in the length direction of the slit-shaped opening so that the cylindrical lenses or the convex lenses form the plurality of point light sources with respect to the slit-shaped opening.

11. The light sensing system of claim 10, wherein units each comprising the light source and the plurality of lenses formed with respect to the slit-shaped opening of the light source are repeatedly one-dimensionally arranged to form the plurality of point light sources in a two-dimensional arrangement.

12. The light sensing system of claim 1, wherein units each comprising the light source and the lens are repeatedly arranged, and each lens in the units is provided so that beams of light respectively emitted from each light source of the units have multiple emission angles.

13. A light detection and ranging (lidar) apparatus comprising:
a light sensing system comprising:
a light source comprising an upper electrode, a lower electrode, and a slit-shaped opening, and configured to emit a linear light beam through the slit-shaped opening,
a lens that is integrated with the light source on the upper electrode of the light source on which the slit-shaped opening is formed, extends in a length direction of the slit-shaped opening, and is configured to make the linear light beam traveled in the length direction of the slit-shaped opening and emitted through an output end of the slit-shaped opening as a point light at a far-field, and
a light receiver configured to receive the point light that is emitted from the light source towards an object, focused or collimated by the lens, and reflected by the object; and
a processor configured to control the light sensing system and to analyze the point light received from the light sensing system,
wherein the lens has a half cylinder shape having two opposing flat semicircular bases, and a curve portion and a flat rectangular portion that oppose each other and are provided between the two opposing flat semicircular bases.

14. The lidar apparatus of claim 13, wherein the light source of the light sensing system comprises an active optical element having an active layer,
wherein the slit-shaped opening is formed in the active optical element, and
wherein the lens is formed on a surface of the active optical element in which the slit-shaped opening is formed.

15. The lidar apparatus of claim 14, wherein the active optical element is configured to perform as at least one of (i) an amplifier to transmit, amplify, and output a light beam incident on the active optical element from the light source and (ii) the light source to generate a light beam.

16. The lidar apparatus of claim 14, wherein the light sensing system comprises a cylindrical lens formed as a single structure on the slit-shaped opening and configured to focus light that disperses with respect to a slit width of the slit-shaped opening to form a single point light source with respect to a single slit-shaped opening.

17. The lidar apparatus of claim 16, wherein, in the light sensing system, a plurality of point light sources arranged one-dimensionally or two-dimensionally are formed by repeatedly one-dimensionally or two-dimensionally arranging units each comprising the light source and the lens.

18. A light detection and ranging (lidar) apparatus comprising:
the light sensing system of claim 9; and
a processor configured to control the light sensing system and to analyze the point light received from the light sensing system,
wherein the light sensing system further comprises a light receiver configured to receive the point light that is emitted from the light source towards an object, focused or collimated by the lens, and reflected by the object.

19. The lidar apparatus of claim 18, wherein the lens comprises cylindrical lenses or convex lenses separately arranged in the length direction of the slit-shaped opening so that the plurality of point light sources are formed with respect to the slit-shaped opening.

20. The lidar apparatus of claim 19, wherein the plurality of point light sources having a two-dimensional arrangement are formed by repeatedly one-dimensionally arranging units each comprising the light source and the plurality of lenses formed with respect to the slit-shaped opening of the light source.

\* \* \* \* \*